(12) United States Patent
Hung et al.

(10) Patent No.: US 10,700,111 B2
(45) Date of Patent: Jun. 30, 2020

(54) OPTICAL SENSOR

(71) Applicant: KINGPAK TECHNOLOGY INC., Hsin-Chu County (TW)

(72) Inventors: Li-Chun Hung, Hsin-Chu County (TW); Chien-Chen Lee, Hsin-Chu County (TW); Hsiu-Wen Tu, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 16/294,436

(22) Filed: Mar. 6, 2019

(65) Prior Publication Data
US 2020/0098809 A1    Mar. 26, 2020

(30) Foreign Application Priority Data
Sep. 25, 2018    (CN) .......................... 2018 1 1114904

(51) Int. Cl.
*H01L 27/146* (2006.01)
*H01L 23/31* (2006.01)
*H01L 23/528* (2006.01)
*H01L 23/498* (2006.01)
*H01L 23/00* (2006.01)

(52) U.S. Cl.
CPC .... *H01L 27/14618* (2013.01); *H01L 23/3114* (2013.01); *H01L 23/49838* (2013.01); *H01L 23/528* (2013.01); *H01L 24/16* (2013.01); *H01L 27/14625* (2013.01)

(58) Field of Classification Search
CPC ......... H01L 27/14618; H01L 27/14625; H01L 27/14643; H01L 23/49838; H01L 23/3114; H01L 23/528; H01L 24/16; H01L 23/30
See application file for complete search history.

(56) References Cited

U.S. PATENT DOCUMENTS

2005/0157911 A1 * 7/2005 Iseri .................... G06K 9/00026
382/124
2009/0267170 A1 * 10/2009 Chien ............... H01L 27/14618
257/434

(Continued)

FOREIGN PATENT DOCUMENTS

TW    201806140 A    2/2018

*Primary Examiner* — Galina G Yushina
(74) *Attorney, Agent, or Firm* — Li & Cai Intellectual Property (USA) Office

(57) ABSTRACT

Disclosed is an optical sensor including a substrate, a redistribution chip structure disposed on the substrate, a sensor chip disposed on the redistribution chip structure, a light-permeable sheet arranged above the sensor chip, metal wires electrically connecting the substrate and the sensor chip, and a package body disposed on the substrate. The redistribution chip structure includes an insulating body, a first electronic chip embedded in the insulating body, and a redistribution layer (RDL) connected to bottoms of the insulating body and the first electronic chip. The RDL is fixed onto the substrate in a flip-chip manner. A projected region defined by orthogonally projecting a sensing area of the sensor chip onto the redistribution chip structure is located inside outer edges of the redistribution chip structure. The redistribution chip structure, the sensor chip, a part of the light-permeable sheet, and the metal wires are embedded in the package body.

9 Claims, 4 Drawing Sheets

(56) References Cited

U.S. PATENT DOCUMENTS

2013/0221470 A1* 8/2013 Kinsman ........... H01L 27/14618
                                                    257/434
2017/0048472 A1* 2/2017 Yang ................. H01L 27/14618
2017/0345864 A1* 11/2017 Kinsman ............. H01L 21/4853
2018/0019178 A1* 1/2018 Lin ....................... H01L 23/492

* cited by examiner

OPTICAL SENSOR

CROSS-REFERENCE TO RELATED PATENT APPLICATION

This application claims the benefit of priority to China Patent Application No. 201811114904.1, filed on Sep. 25, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor, and more particularly to an optical sensor.

BACKGROUND OF THE DISCLOSURE

A conventional optical sensor has a configuration with a small-sized die stacked on a large-sized die, wherein the large-sized die is electrically connected to the substrate by wire-bonding at a periphery portion of the large-sized die. However, during the wire-bonding of the conventional optical sensor, since the periphery portion of the large-sized die is suspended over the substrate, an external force exerted by the wire-bonding can often result in defects within the conventional optical sensor.

SUMMARY OF THE DISCLOSURE

In response to the above-referenced technical inadequacies, the present disclosure provides an optical sensor to effectively improve the issues associated with conventional optical sensors.

In one aspect, the present disclosure provides an optical sensor, which includes a substrate, a redistribution chip structure, a sensor chip, a light-permeable sheet, a plurality of metal wires, and a package body. The redistribution chip structure includes an insulating body, a first electronic chip embedded in the insulating body, a redistribution layer (RDL) connected to a bottom of the insulating body and a bottom of the first electronic chip. The RDL is electrically connected to the first electronic chip, and the redistribution chip structure is fixed onto the substrate through the RDL in a flip-chip manner. The sensor chip has a size larger than that of the first electronic chip, and the sensor chip is disposed on the redistribution chip structure. A top surface of the sensor chip has a sensing area, and a projected area defined by orthogonally projecting the sensing area onto the redistribution chip structure is located inside of outer edges of the redistribution chip structure. The light-permeable sheet is arranged above the sensor chip. The metal wires are electrically connected to the substrate and the sensor chip. The package body is disposed on the substrate. The redistribution chip structure, the sensor chip, and the metal wires are embedded in the package body. The package body retains the light-permeable sheet at a position above the sensor chip, and a portion of an outer surface of the light-permeable sheet is exposed from the package body.

Therefore, in each of the optical sensors disclosed by the embodiments of the present disclosure, the first electronic chip is embedded in the insulating body of the redistribution chip structure, which makes the sensor chip and the redistribution chip structure disposed at a specific configuration (e.g., the projected area defined by orthogonally projecting the sensing area of the sensor chip onto the redistribution chip structure is located inside of outer edges of the redistribution chip structure), so that the redistribution chip structure can effectively support the sensor chip to resist an external force applied to the sensor chip in a wire bonding process of the sensor chip. Accordingly, defects of the optical sensor caused by the external force can be avoided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
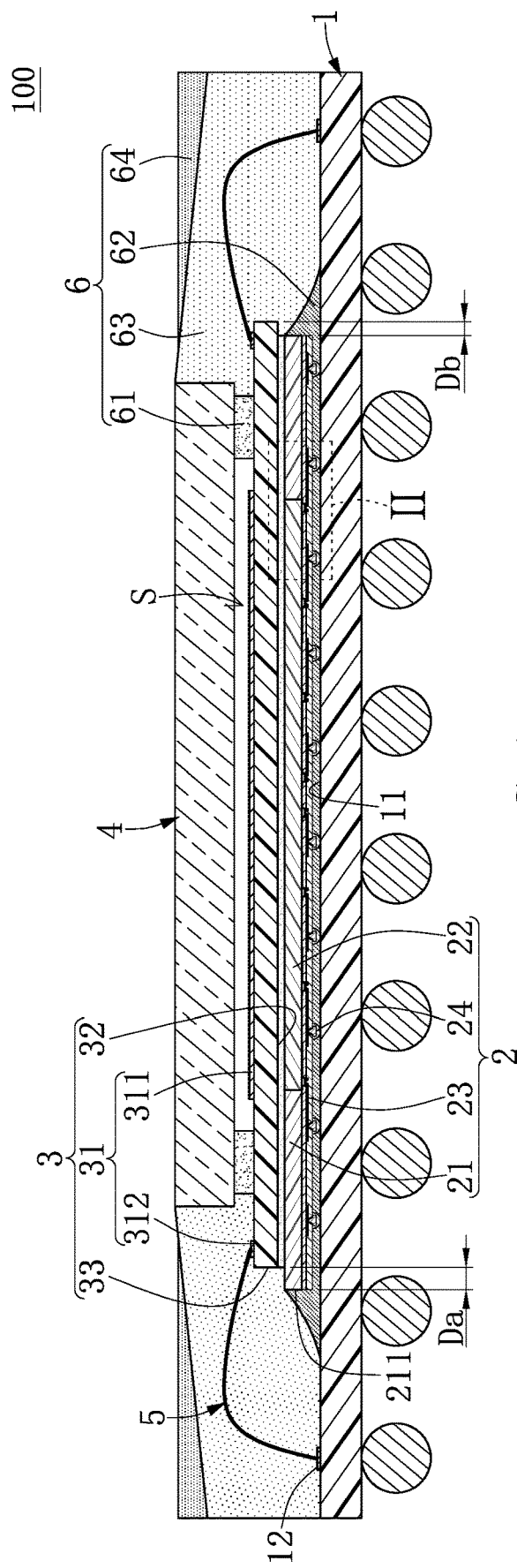
FIG. 1 is a cross-sectional view of an optical sensor according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

First Embodiment

Figure 2:
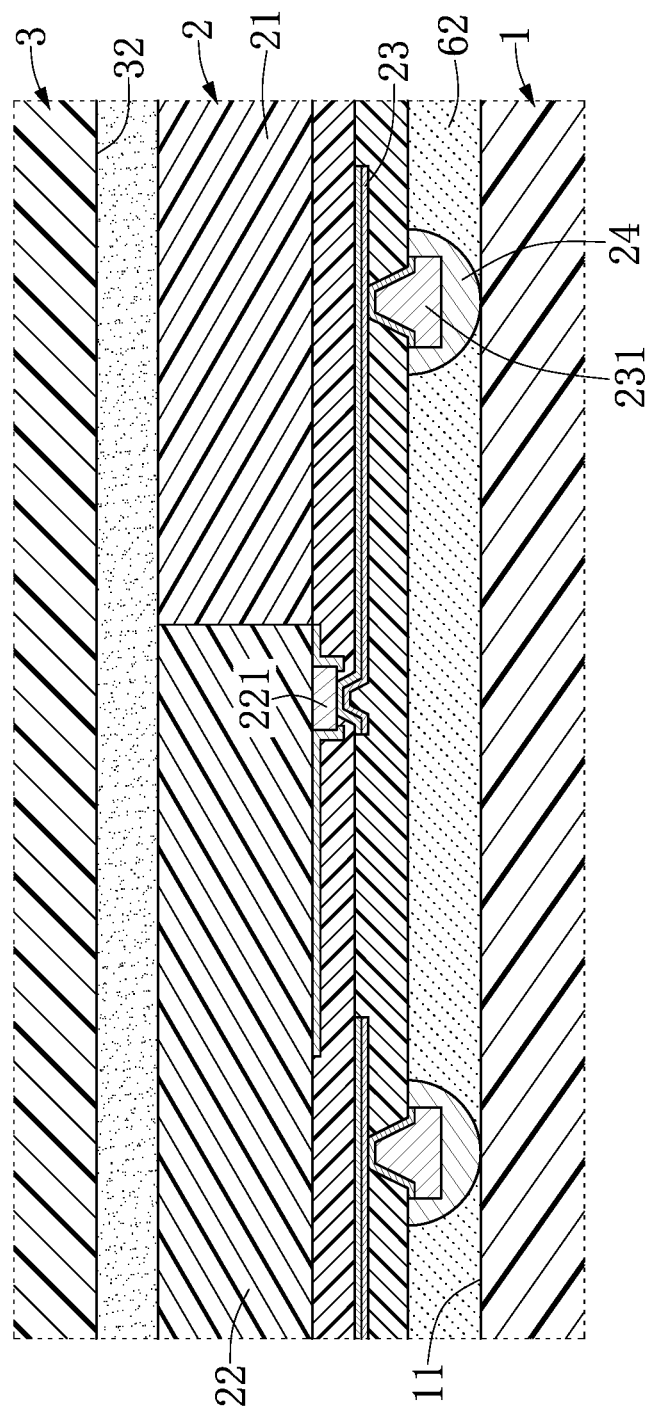
FIG. 2 is an enlarged view of portion II of FIG. 1.
Figure 3:
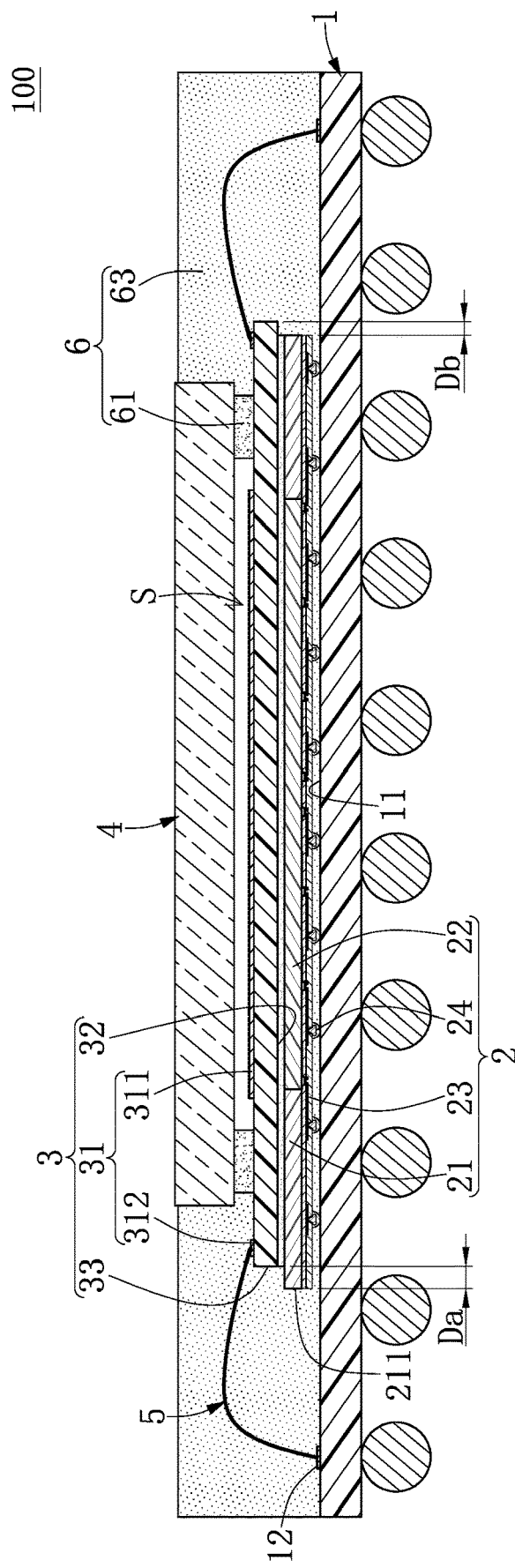
FIG. 3 is a cross-sectional view showing the optical sensor in another configuration.

Referring to FIG. 1 to FIG. 3, a first embodiment of the present disclosure provides an optical sensor 100. As shown in FIG. 1 and FIG. 2, the optical sensor 100 includes a substrate 1, a redistribution chip structure 2 disposed on the substrate 1, a sensor chip 3 disposed on the redistribution chip structure 2, a light-permeable sheet 4 arranged above the sensor chip 3, a plurality of metal wires 5 electrically connected to the substrate 1 and the sensor chip 3, and a package body 6 disposed on the substrate 1.

It should be clarified first that, in order to conveniently illustrate the optical sensor 100, the drawings of the present embodiment are depicted as cross-sectional views, but it could be understood that the portions of the optical sensor 100 not shown in the drawings shall also have similar structures. For example, FIG. 1 shows only two of the metal wires 5, but the portions of the optical sensor 100 not shown in FIG. 1 also include other metal wires 5. In the following context, structure and connection of each component of the optical sensor 100 are respectively recited.

The substrate 1 in the present embodiment is in a square or rectangular shape. A top surface of the substrate 1 includes a chip-bonding region 11 arranged on a substantially center portion thereof, and the substrate 1 includes a plurality of first pads 12 disposed on a portion of the top surface outside of the chip-bonding region 11. Moreover, the substrate 1 is further provided with a plurality of solder balls (not labeled) disposed on a bottom surface thereof. The substrate 1 can be soldered onto an electronic component (e.g., a printed circuit board) through the solder balls, thereby electrically connecting the optical sensor 100 to the electronic component.

The redistribution chip structure 2 includes an insulating body 21, a first electronic chip 22 embedded in the insulating body 21, a redistribution layer (RDL) 23 connected to a bottom of the insulating body 21 and a bottom of the first electronic chip 22, and a plurality of solder balls 24. The first electronic chip 22 in the present embodiment is illustrated as an image signal processor, but the present disclosure is not limited thereto.

Specifically, the insulating body 21 in the present embodiment is formed by molding to surround the perimeter of the first electronic chip 22, and a top surface and a bottom surface of the insulating body 21 are respectively flush with a top surface and a bottom surface of the first electronic chip 22. The RDL 23 is formed on the bottom surfaces of the insulating body 21 and the first electronic chip 22, and the RDL 23 is electrically connected to the first electronic chip 22. A plurality of contacts 221 on the bottom surface of the first electronic chip 22 may connect to a plurality of new contacts 231 disposed on a bottom portion of the redistribution chip structure 2 through the RDL 23, and a distance between any two adjacent new contacts 231 is larger than a distance between any two adjacent contacts 221. In other words, the RDL 23 is a circuit fan-out structure. In addition, a portion of the RDL 23 beneath the insulating body 21 is preferably provided with at least some of the new contacts 231, but the present disclosure is not limited thereto. The solder balls 24 respectively cover the new contacts 231.

Moreover, the redistribution chip structure 2 is fixed onto the chip-bonding region 11 of the substrate 1 through the RDL 23 in a flip-chip manner. In the present embodiment, the RDL 23 is soldered onto the chip-bonding region 11 of the substrate 1 through the solder balls 24. Herein, "soldered" means both a structural connection and an electrical connection.

The sensor chip 3 in the present embodiment is illustrated as an image sensing chip, but the present disclosure is not limited thereto. The sensor chip 3 includes a top surface 31 and a bottom surface 32 opposite to the top surface 31. The top surface 31 of the sensor chip 3 has a sensing area 311 arranged at a substantial center portion thereof. The sensor chip 3 includes a plurality of second pads 312 disposed on a portion of the top surface 31 outside of the sensing area 311, and a quantity and positions of the second pads 312 correspond to those of the first pads 12.

Moreover, the sensor chip 3 has a size larger than that of the first electronic chip 22, and the sensor chip 3 is disposed on the redistribution chip structure 2. For example, the bottom surface 32 of the sensor chip 3 is fixed onto the top surface of the insulating body 21 and the top surface of the first electronic chip 22 by an adhesive layer (not shown).

From another point of view, a projected area defined by orthogonally projecting the sensing area 311 of the sensor chip 3 onto the redistribution chip structure 2 is located inside of outer edges of the redistribution chip structure 2 (such as, the lateral sides 211 of the insulating body 21 shown in FIG. 1). In the present embodiment, the projected area preferably covers the first electronic chip 22, but the present disclosure is not limited thereto.

Specifically, at least one of the lateral sides 211 (i.e., the left lateral side 211 shown in FIG. 1) of the insulating body 21 protrudes from an adjacent lateral side 33 (i.e., the left lateral side 33 shown in FIG. 1) of the sensor chip 3 by a distance Da that is less than 1 mm, but the present disclosure is not limited thereto. For example, in other embodiments not shown in the drawings of the present disclosure, each of the lateral sides 211 of the insulating body 21 can protrude from the adjacent lateral side 33 of the sensor chip 3 by the distance Da.

Moreover, at least one of the lateral sides 211 (i.e., the right lateral side 211 shown in FIG. 1) of the insulating body 21 is recessed from an adjacent lateral side 33 (i.e., the right lateral side 33 shown in FIG. 1) of the sensor chip 3 by a distance Db that is less than 1 mm, but the present disclosure is not limited thereto. For example, in other embodiments not shown in the drawings of the present disclosure, each of the lateral sides 211 of the insulating body 21 can be recessed from the adjacent lateral side 33 of the sensor chip 3 by the distance Db.

Each of the metal wires 5 has a first end and an opposite second end, the first ends of the metal wires 5 are respectively connected to the first pads 12 of the substrate 1, and the second ends of the metal wires 5 are respectively connected to the second pads 312 of the sensor chip 3, so that the substrate 1 and the sensor chip 3 can be electrically connected to each other through the metal wires 5.

According to what mentioned above, the first electronic chip 22 is embedded in the insulating body 21 of the redistribution chip structure 2, making the sensor chip 3 and the redistribution chip structure 2 disposed at a specific configuration (e.g., the projected area defined by orthogonally projecting the sensing area 311 of the sensor chip 3 onto the redistribution chip structure 2 is located inside of the outer edges of the redistribution chip structure 2), so that the redistribution chip structure 2 can effectively support the sensor chip 3 to resist an external force applied onto the sensor chip 3 in a wire bonding process of the sensor chip 3. Accordingly, defects of the optical sensor 100 caused by the external force can be avoided.

Specifically, the distance Da is formed between one of the lateral sides 211 of the insulating body 21 and an adjacent one of the lateral sides 33 of the sensor chip 3, and the distance Db is formed between the other of the lateral sides 211 of the insulating body 21 and the other adjacent lateral side 33 of the sensor chip 3. Both of the distances Da and Db are less than 1 mm. It turns out that air bubbles are prevented from appearing between the sensor chip 3 and the substrate 1.

Moreover, the redistribution chip structure 2 in the present embodiment is fixed onto the chip-bonding region 11 of the substrate 1 in a flip-chip manner. That is to say, the redistribution chip structure 2 is located inboard the first pads 12. Accordingly, the redistribution chip structure 2 connects to the substrate 1 in a manner other than wire bonding, so that the production cost of the optical sensor 100 can be effectively reduced, and a short circuit drawback is prevented from occurring between the redistribution chip structure 2 and the sensor chip 3.

The light-permeable sheet 4 in the present embodiment is illustrated by taking it as a flat and transparent glass, but the present disclosure is not limited thereto. The light-permeable sheet 4 is arranged above the top surface 31 of the sensor chip 3 through the package body 6 (e.g., a supporting part 61 of the package body 6 disclosed in the following description). The light-permeable sheet 4 faces the sensing area 311 of the sensor chip 3, and the light-permeable sheet 4, the supporting part 61 of the package body 6, and the sensor chip 3 jointly form a closed space S.

Moreover, the size of the light-permeable sheet 4 in the present embodiment is smaller than that of the sensor chip 3. Specifically, a projected area defined by orthogonally projecting the light-permeable sheet 4 onto the top surface 31 of the sensor chip 3 covers the sensing area 311 and is located inside of the lateral sides 33 of the sensor chip 3, but the present disclosure is not limited thereto.

The package body 6 is disposed on the substrate 1. The redistribution chip structure 2, the sensor chip 3, and the metal wires 5 are embedded in the package body 6. The package body 6 retains the light-permeable sheet 4 at a position above the sensor chip 3, and a portion of an outer surface (e.g., the top surface shown in FIG. 1) of the light-permeable sheet 4 is exposed from the package body 6.

Specifically, the package body 6 mainly includes a covering part 63 and a molding part 64. The package body 6 in the present embodiment includes a supporting part 61 (e.g., a glue), an underfill part 62 (e.g., an underfill epoxy), a covering part 63, and a molding part 64 (e.g., a molding compound). That is to say, the supporting part 61 and the underfill part 62 may be regarded as a portion of the package body 6. The supporting part 61 is sandwiched between the top surface 31 of the sensor chip 3 and the light-permeable sheet 4, and the supporting part 61 is arranged outside of the sensing area 311 and inboard the second pads 312. The underfill part 62 fully fills in a gap between the substrate 1 and the redistribution chip structure 2. In other words, the solder balls 24 of the redistribution chip structure 2 are embedded in the underfill part 62.

Moreover, the covering part 63 is disposed on the substrate 1. The redistribution chip structure 2, the sensor chip 3, and the supporting part 61 are embedded in the covering part 63, and the portion of the outer surface (e.g., the top surface shown in FIG. 1) of the light-permeable sheet 4 is exposed from the covering part 63. In other words, the covering part 63 encloses outer edges of the unferfill part 62, the redistribution chip structure 2, the sensor chip 3, the supporting part 61, and the light-permeable sheet 4. Each of the metal wires 5 in the present embodiment is entirely embedded in the covering part 63.

In addition, the covering part 63 in the present embodiment is formed by a solidified liquid compound, and the molding part 64 is formed on a top surface of the covering part 63 by molding, but the present disclosure is not limited thereto. For example, in other embodiments not shown in the drawings of the present disclosure, the package body 6 can be formed without the molding part 64.

As shown in FIG. 1, the package body 6 in the present embodiment is illustrated by including the supporting part 61, the covering part 63, the underfill part 62, and the molding part 64, but the present disclosure is not limited thereto. For example, in another embodiment having a structure similar to the optical sensor 100 in FIG. 3, the package body 6 is formed without the underfill part 62, and the gap between the substrate 1 and the redistribution chip structure 2 is fully filled with the covering part 63. Moreover, the covering part 63 is preferably formed by molding so as to easily fill into the gap between the substrate 1 and the redistribution chip structure 2.

Second Embodiment

Figure 4:
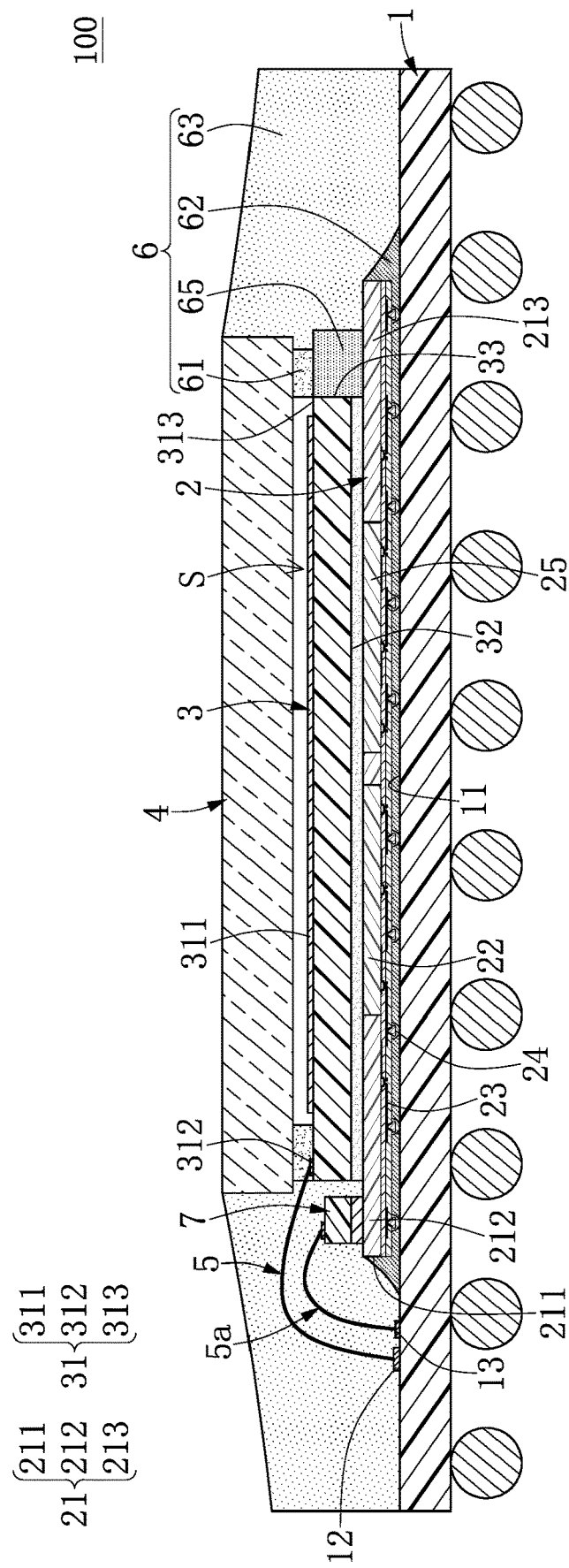
FIG. 4 is cross-sectional view of an optical sensor according to a second embodiment of the present disclosure.

Referring to FIG. 4, which illustrates a second embodiment of the present disclosure, the second embodiment resembles the first embodiment, and similar parts of the two embodiments shall not be recited again. The differences between the two embodiments are mainly described in the following context.

In the present embodiment, the redistribution chip structure 2 further includes a second electronic chip 25. The second electronic chip 25 is embedded in the package body 21 and is spaced apart from the first electronic chip 22, and a projected area defined by orthogonally projecting the sensing area 311 of the sensor chip 3 onto the redistribution chip structure 2 preferably covers the first electronic chip 22 and the second electronic chip 25, but the present disclosure is not limited thereto. Moreover, the RDL 23 is formed on the bottom of the insulating body 21, the bottom of the first electronic chip 22, and a bottom of the second electronic chip 25, and each of the first electronic chip 22 and the second electronic chip 25 is electrically connected to the RDL 23.

Specifically, the optical sensor 100 further includes a third electronic chip 7 that is not embedded in the redistribution chip structure 2, and the substrate 1 and the insulating body 21 further include the following structures for the third electronic chip 7.

The insulating body 21 includes an extending portion 212 protruding from the sensor chip 3, and the substrate 1 includes a third pad 13 arranged inboard the first pads 12 and adjacent to the extending portion 212. In other words, the third pad 13 is substantially located between the extending portion 212 and one of the first pads 12 adjacent to the extending portion 212, but the present disclosure is not limited thereto.

Moreover, the third electronic chip 7 is disposed on the extending portion 212, and the third electronic chip 7 is electrically connected to the third pad 13 of the substrate 1 by a wire 5a. The third electronic chip 7 is arranged adjacent to the sensor chip 3, and a height of the third electronic chip 7 with respect to the insulating body 21 is lower than a height of the top surface 31 of the sensor chip 3 with respect to the insulating body 21, thereby preventing a signal of the third electronic chip 7 from interfering with a signal that travels along the metal wire 5 near the third electronic chip 7.

In addition, the top surface 31 of the sensor chip 3 includes a non-wiring region 313 that is arranged outside of the sensing area 311 and does not contact the metal wires 5, and structures on the left portion and the right portion of the sensor chip 3 shown in FIG. 4 of the present embodiment are not symmetrical to each other with respect to the sensing area 311. The insulating body 21 and the package body 6 further include the following structures for the non-wiring region 313.

The size of the light-permeable sheet 4 is larger than that of the sensor chip 3, and the size of the redistribution chip structure 2 is larger than that of the light-permeable sheet 4.

The insulating body 21 includes a carrying portion 213 protruding from the non-wiring region 313 of the sensor chip 3, and the package body 6 includes an extending part 65 disposed on the carrying portion 213 and adjacent to the non-wiring region 313. The extending part 65 in the present embodiment is connected to the lateral side 33 (e.g., the right lateral side 33 shown in FIG. 4) of the sensor chip 3 adjacent to the non-wiring region 313. A height of the extending part 65 with respect to the insulating body 21 is preferably higher than a height of the non-wiring region 313 with respect to the insulating body 21.

Specifically, a portion of the supporting part 61 (e.g., on the left portion of the sensor chip 3 shown in FIG. 4) is sandwiched between the top surface 31 of the sensor chip 3 and the light-permeable sheet 4, the other portion of the supporting part 61 (e.g., near the right portion of the sensor chip 3 shown in FIG. 4) is sandwiched between the extending part 65 and the light-permeable sheet 4, and the supporting part 61 is embedded in the covering part 63. However, in other embodiments not depicted in the present disclosure, the extending part 65 may be removed from the package body 6. That is to say, structures on the left portion and the right portion of the sensor chip 3 may be made symmetrical to each other, so that the supporting part 61 may be entirely sandwiched between the top surface 31 of the sensor chip 3 and the light-permeable sheet 4. According to above, the supporting part 61 can be at least partially sandwiched between the top surface 31 of the sensor chip 3 and the light-permeable sheet 4.

Moreover, a portion of each of the metal wires 5 and the corresponding second pad 312 are embedded in the supporting part 61, and the other portion of each of the metal wires 5 and the corresponding first pad 12 are embedded in the covering part 63, but the present disclosure is not limited thereto.

In addition, in other embodiments not shown in the drawings of the present disclosure, the optical sensors 100 disclosed in the first and second embodiments may be modified to exchange inner structures according to design requirements. For example, the substrate 1 and the insulating body 21 may be formed with the structures as those described in the second embodiment, given the optical sensor 100 of the first embodiment is provided with the third electronic chip 7.

In conclusion, in the optical sensor 100 of the present disclosure, the first electronic chip 22 is embedded in the insulating body 21 of the redistribution chip structure 2, and the sensor chip 3 and the redistribution chip structure 2 are disposed at a specific configuration (e.g., the projected area defined by orthogonally projecting the sensing area 311 of the sensor chip 3 onto the redistribution chip structure 2 is located inside of outer edges of the redistribution chip structure 2), so that the redistribution chip structure 2 can effectively support the sensor chip 3 to resist an external force applied to the sensor chip 3 in a wire bonding process of the sensor chip 3.

Specifically, the distances Da and Db (both of them are less than 1 mm), are respectively formed between the lateral sides 211 of the insulating body 21 and adjacent lateral sides 33 of the sensor chip 3, it turns out that slits between the sensor chip 3 and the substrate 1 are prevented from becoming too long and narrow, which further makes it difficult to generate air bubbles between the sensor chip 3 and the substrate 1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical sensor, comprising:
    a substrate;
    a redistribution chip structure including an insulating body, a first electronic chip embedded in the insulating body, a redistribution layer (RDL) connected to a bottom of the insulating body and a bottom of the first electronic chip, wherein the RDL is electrically connected to the first electronic chip, and the redistribution chip structure is fixed onto the substrate through the RDL in a flip-chip manner;
    a sensor chip having a size larger than that of the first electronic chip, the sensor chip being disposed on the redistribution chip structure, wherein a top surface of the sensor chip has a sensing area, and a projected area defined by orthogonally projecting the sensing area onto the redistribution chip structure is located inside of outer edges of the redistribution chip structure;
    a light-permeable sheet arranged above the sensor chip;
    a plurality of metal wires electrically connecting the substrate and the sensor chip; and
    a package body disposed on the substrate, wherein the redistribution chip structure, the sensor chip, and the metal wires are embedded in the package body, the package body retains the light-permeable sheet at a position above the sensor chip and exposes a portion of an outer surface of the light-permeable sheet, wherein the package body includes:
        a supporting part at least partially sandwiched between a top surface of the sensor chip and the light-permeable sheet; and
        a covering part disposed on the substrate, wherein the redistribution chip structure, the sensor chip, and the supporting part are embedded in the covering part, and the portion of the outer surface of the light-permeable sheet is exposed from the covering part,
    wherein the top surface of the sensor chip includes a non-wiring region that is arranged outside of the sensing area and does not contact the metal wires, the insulating body includes a carrying portion protruding from the non-wiring region of the sensor chip, and the package body includes an extending part disposed on the carrying portion and adjacent to the non-wiring region, and wherein a portion of the supporting part is sandwiched between the top surface of the sensor chip and the light-permeable sheet, the other portion of the supporting part is sandwiched between the extending part and the light-permeable sheet, and the supporting part is embedded in the covering part.

2. The optical sensor according to claim 1, wherein the redistribution chip structure includes a second electronic chip, the second electronic chip is embedded in the package body and is spaced apart from the first electronic chip, and each of the first electronic chip and the second electronic chip is electrically connected to the RDL.

3. The optical sensor according to claim 2, wherein the insulating body includes an extending portion protruding from the sensor chip, the optical sensor further includes a third electronic chip disposed on the extending portion, and the third electronic chip is electrically connected to the substrate by wire bonding.

4. The optical sensor according to claim 1, wherein at least a portion of one lateral side of the insulating body protrudes a distance relative to an adjacent lateral side of the sensor chip, and the distance is less than 1 mm.

5. The optical sensor according to claim 1, wherein at least a portion of one lateral side of the insulating body is recessed relative to an adjacent lateral side of the sensor chip by a distance that is less than 1 mm.

6. The optical sensor according to claim 1, wherein the redistribution chip structure includes a plurality of solder balls, and the RDL is soldered onto the substrate through the solder balls, and wherein the package body includes an underfill filling a gap between the substrate and the redistribution chip structure.

7. The optical sensor according to claim 1, wherein a portion of each of the metal wires is embedded in the supporting part, and the other portion of each of the metal wires is embedded in the covering part.

8. The optical sensor according to claim 1, wherein the redistribution chip structure includes a plurality of solder balls, and the RDL is soldered onto the substrate through the solder balls, and wherein the package body includes an underfill part filling a gap between the substrate and the redistribution chip structure.

9. An optical sensor, comprising:
   a substrate;
   a redistribution chip structure including an insulating body, a first electronic chip embedded in the insulating body, a redistribution layer (RDL) connected to a bottom surface of the insulating body and a bottom surface of the first electronic chip, wherein the insulating body surrounds and is connected to lateral sides of the first electronic chip, and a top surface and the bottom surface of the insulating body are flush with a top surface and the bottom surface of the first electronic chip, respectively, and wherein the RDL is electrically connected to the first electronic chip, and the redistribution chip structure is fixed onto the substrate through the RDL in a flip-chip manner;
   a sensor chip having a size larger than that of the first electronic chip, the sensor chip being disposed on the redistribution chip structure, wherein a top surface of the sensor chip has a sensing area, and a projected area defined by orthogonally projecting the sensing area onto the redistribution chip structure is located inside of outer edges of the redistribution chip structure;
   a light-permeable sheet arranged above the sensor chip;
   a plurality of metal wires electrically connecting the substrate and the sensor chip; and
   a package body disposed on the substrate, wherein the redistribution chip structure, the sensor chip, and the metal wires are embedded in the package body, the package body retains the light-permeable sheet at a position above the sensor chip and exposes a portion of an outer surface of the light-permeable sheet.

* * * * *